(12) United States Patent
Cheng et al.

(10) Patent No.: US 10,157,935 B2
(45) Date of Patent: Dec. 18, 2018

(54) NANOSHEET CAPACITOR

(71) Applicant: International Business Machines Corporation, Armonk, NY (US)

(72) Inventors: Kangguo Cheng, Schenectady, NY (US); Juntao Li, Cohoes, NY (US); Geng Wang, Stormville, NY (US); Qintao Zhang, Mt. Kisco, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/439,417

(22) Filed: Feb. 22, 2017

(65) Prior Publication Data
US 2018/0083046 A1   Mar. 22, 2018

Related U.S. Application Data

(63) Continuation of application No. 15/273,106, filed on Sep. 22, 2016, now Pat. No. 9,653,480.

(51) Int. Cl.
*H01L 27/12* (2006.01)
*H01L 29/423* (2006.01)
*H01L 21/84* (2006.01)
*H01L 29/778* (2006.01)
*H01L 29/06* (2006.01)
*H01L 49/02* (2006.01)
(Continued)

(52) U.S. Cl.
CPC ........ *H01L 27/1211* (2013.01); *H01L 21/845* (2013.01); *H01L 28/82* (2013.01); *H01L 29/0665* (2013.01); *H01L 29/0673* (2013.01); *H01L 29/423* (2013.01); *H01L 29/42392* (2013.01); *H01L 29/778* (2013.01); *H01L 29/7853* (2013.01); *H01L 29/94* (2013.01)

(58) Field of Classification Search
CPC ... H01L 27/1211; H01L 21/845; H01L 28/82; H01L 29/0665; H01L 29/42392; H01L 29/778; H01L 29/7853; H01L 29/94
See application file for complete search history.

(56) References Cited

U.S. PATENT DOCUMENTS

| | | | |
|---|---|---|---|
| 9,985,097 B2* | 5/2018 | Cheng | H01L 29/0665 |
| 2016/0020305 A1* | 1/2016 | Obradovic | H01L 29/7391 257/39 |
| 2017/0040321 A1* | 2/2017 | Mitard | H01L 29/78684 |

OTHER PUBLICATIONS

List of IBM Patents or Patent Application Treasted as Related (Appendix P); Filed Feb. 22, 2017, 2 pages.
(Continued)

*Primary Examiner* — Yasser A Abdelaziez
(74) *Attorney, Agent, or Firm* — Cantor Colburn LLP; Vazken Alexanian

(57) ABSTRACT

Embodiments are directed to a method of forming a semiconductor device and resulting structures having a nanosheet capacitor by forming a first nanosheet stack over a substrate. The first nanosheet stack includes a first nanosheet vertically stacked over a second nanosheet. A second nanosheet stack is formed over the substrate adjacent to the first nanosheet stack. The second nanosheet stack includes a first nanosheet vertically stacked over a second nanosheet. Exposed portions of the first and second nanosheets of the second nanosheet stack are doped and gates are formed over channel regions of the first and second nanosheet stacks.

9 Claims, 15 Drawing Sheets

(51) Int. Cl.
*H01L 29/94* (2006.01)
*H01L 29/78* (2006.01)

(56) References Cited

OTHER PUBLICATIONS

Kangguo Cheng, et al. "Nanosheet Capacitor," U.S. Appl. No. 15/273,106, filed Sep. 22, 2016.

\* cited by examiner

US 10,157,935 B2

NANOSHEET CAPACITOR

DOMESTIC PRIORITY

This application is a continuation of co-pending U.S. patent application Ser. No. 15/273,106, filed Sep. 22, 2016, the disclosure of which is incorporated by reference herein in its entirety.

BACKGROUND

The present invention relates in general to semiconductor device fabrication methods and resulting structures. More specifically, the present invention relates to fabrication methods and resulting structures for a semiconductor device having a nanosheet capacitor.

In contemporary semiconductor device fabrication processes a large number of semiconductor devices, such as field effect transistors (FETs) and on-chip capacitors, are fabricated on a single wafer. Some non-planar device architectures, such as nanosheet capacitors, provide increased device density and some increased performance over lateral devices. In nanosheet capacitors, in contrast to conventional capacitors, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

According to an embodiment of the present invention, a method of fabricating a semiconductor device having a nanosheet capacitor is provided. The method can include forming a first nanosheet stack over a substrate. The first nanosheet stack includes a first nanosheet vertically stacked over a second nanosheet. A second nanosheet stack is formed over the substrate adjacent to the first nanosheet stack. The second nanosheet stack includes a first nanosheet vertically stacked over a second nanosheet. Exposed portions of the first and second nanosheets of the second nanosheet stack are doped and gates are formed over channel regions of the first and second nanosheet stacks.

According to an embodiment of the present invention, a method of fabricating a semiconductor device having a nanosheet capacitor is provided. The method can include forming a nanosheet stack over a substrate. The nanosheet stack includes a first nanosheet vertically stacked over a second nanosheet. A first doped region is formed adjacent to a first end of the nanosheet stack. A second doped region is formed adjacent to a second, opposite end of the nanosheet stack. Exposed portions of the first and second nano sheets are doped and a gate is formed over a channel region of the first and second nanosheets.

According to an embodiment of the present invention, a structure having a nanosheet capacitor is provided. The structure can include a first nanosheet stack formed over a substrate. The first nanosheet stack includes a first nanosheet vertically stacked over a second nanosheet. A second nanosheet stack adjacent to the first nanosheet stack is formed over the substrate. The second nanosheet stack includes a first nanosheet vertically stacked over a second nanosheet. A dopant is formed in a channel region of the first and second nanosheets of the second nanosheet stack. Gates are formed over a channel region of the first and second nanosheets.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
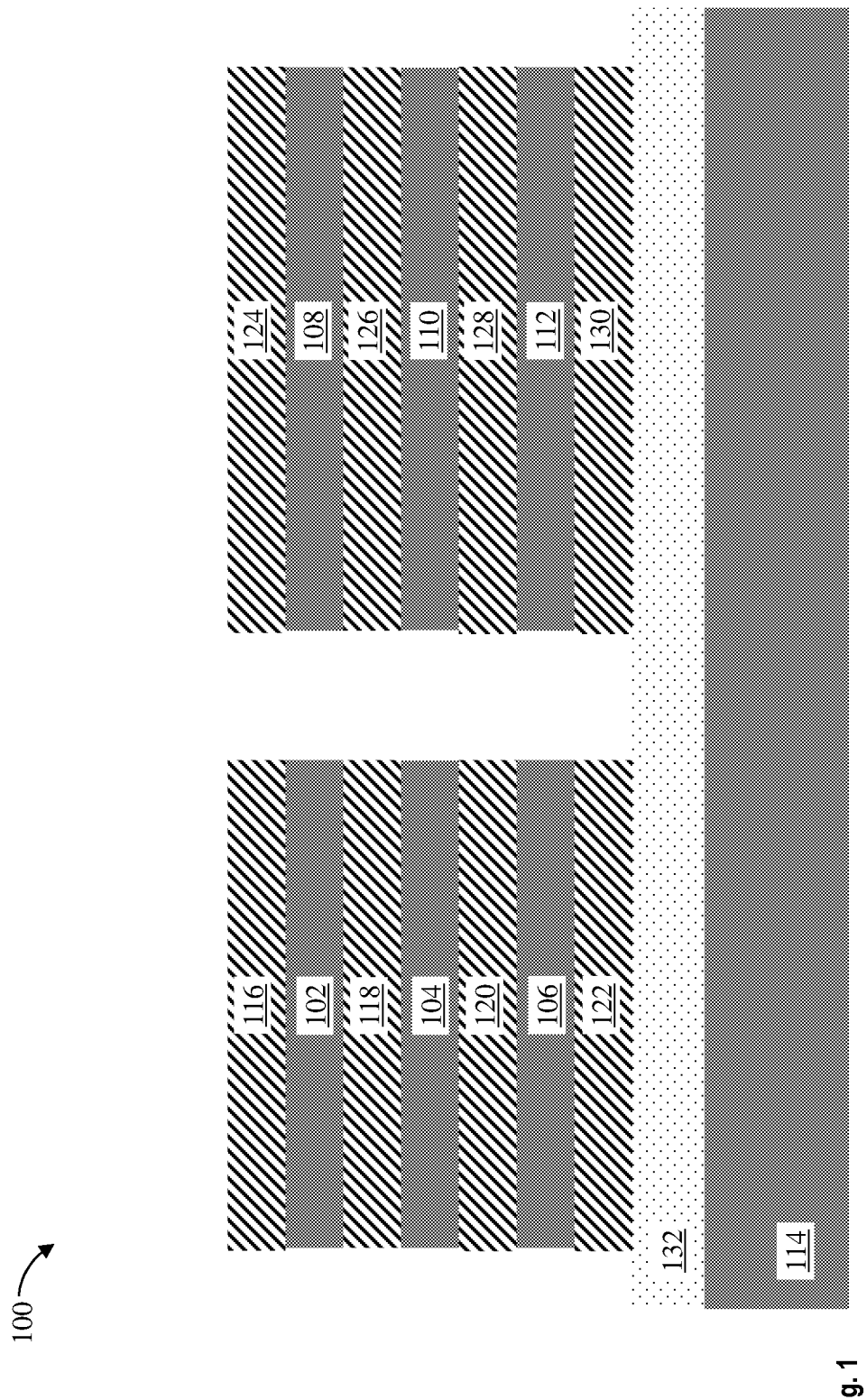
FIG. 1 depicts a cross-sectional view of a structure having FET nanosheets and capacitor nanosheets formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures, such as vertical fin and nanosheet FET devices, result in increased device density over lateral devices. However, there are challenges in providing non-planar architectures for scaling beyond the 7 nm node. For example, on-chip nanosheet-based capacitors that can be integrated with nanosheet CMOS technology are needed. Nanosheet-based capacitors provide a non-planar device topology that advantageously increases the capacitance per footprint and enables improved control of short channel effects. Thus, a method is desired for forming an on-chip nanosheet capacitor and for forming a nanosheet capacitor simultaneously with a nanosheet FET.

Turning now to an overview of the aspects of the present invention, one or more embodiments provide methods of fabricating a semiconductor device having a nanosheet capacitor adjacent to a nanosheet FET. A hard mask is formed over the nanosheet FET so that sidewall spacers can be removed from the nanosheet capacitor. Exposed portions of the nanosheet capacitor are doped before the hard mask over the nanosheet FET is removed. Conductive gates are then formed in both the nanosheet capacitor and nanosheet FET. The methods for fabricating a semiconductor device having a nanosheet capacitor and the resulting structures therefrom in accordance with embodiments of the present invention are described in detail below by referring to the accompanying drawings in FIGS. 1-15.

FIG. 1 illustrates a cross-sectional view of a structure 100 having FET nanosheets 102, 104, and 106 (collectively referred to as a first nanosheet stack) and capacitor nanosheets 108, 110, and 112 (collectively referred to as a second nanosheet stack) formed on a substrate 114 during an intermediate operation of a method of fabricating a semiconductor device according to one or more embodiments. In some embodiments, the FET nanosheets 102, 104, and 106 and capacitor nanosheets 108, 110, and 112 are vertically-stacked nanosheets. In some embodiments, the FET nanosheets 102, 104, and 106 alternate with sacrificial layers 116, 118, 120, and 122 and the capacitor nanosheets 108, 110, and 112 alternate with sacrificial layers 124, 126, 128, and 130. For ease of discussion reference is made to operations performed on and to a nanosheet FET and nanosheet capacitor each having three nanosheets. It is understood, however, that the nanosheet FET and nanosheet capacitor can each include any number of nanosheets alternating with a corresponding number of sacrificial layers. For example, the nanosheet FET and nanosheet capacitor can each include a single nanosheet, two nanosheets, five nanosheets, eight nanosheets, or any number of nanosheets. The nanosheets can be any suitable material such as, for example, monocrystalline silicon or silicon germanium. In some embodiments, the nanosheets 102, 104, 106, 108, 110, and 112 have a thickness of about 4 nm to about 10 nm, although other thicknesses are within the contemplated scope of the invention. In yet other embodiments, the nanosheets 102, 104, 106, 108, 110, and 112 have a thickness of about 6 nm, although other thicknesses are within the contemplated scope of the invention. In some embodiments, the nanosheets 102, 104, 106, 108, 110, and 112 are patterned using, for example, a sidewall image transfer (SIT) operation, a wet etch process, or a dry etch process, to form adjacent nanosheet fins (as depicted in FIG. 2).

The substrate 114 can be any suitable substrate material, such as, for example, monocrystalline Si, SiGe, SiC, III-V compound semiconductor, II-VI compound semiconductor, or semiconductor-on-insulator (SOI). In some embodiments, the substrate 114 includes a buried oxide layer (BOX) 132. In some embodiments, the sacrificial layers 116, 118, 120, 122, 124, 126, 128, and 130 can be silicon germanium. In some embodiments, the sacrificial layers 116, 118, 120, 122, 124, 126, 128, and 130 have a thickness of about 4 nm to about 10 nm. In yet other embodiments, the sacrificial layers 116, 118, 120, 122, 124, 126, 128, and 130 have a thickness of about 6 nm.

Figure 2:
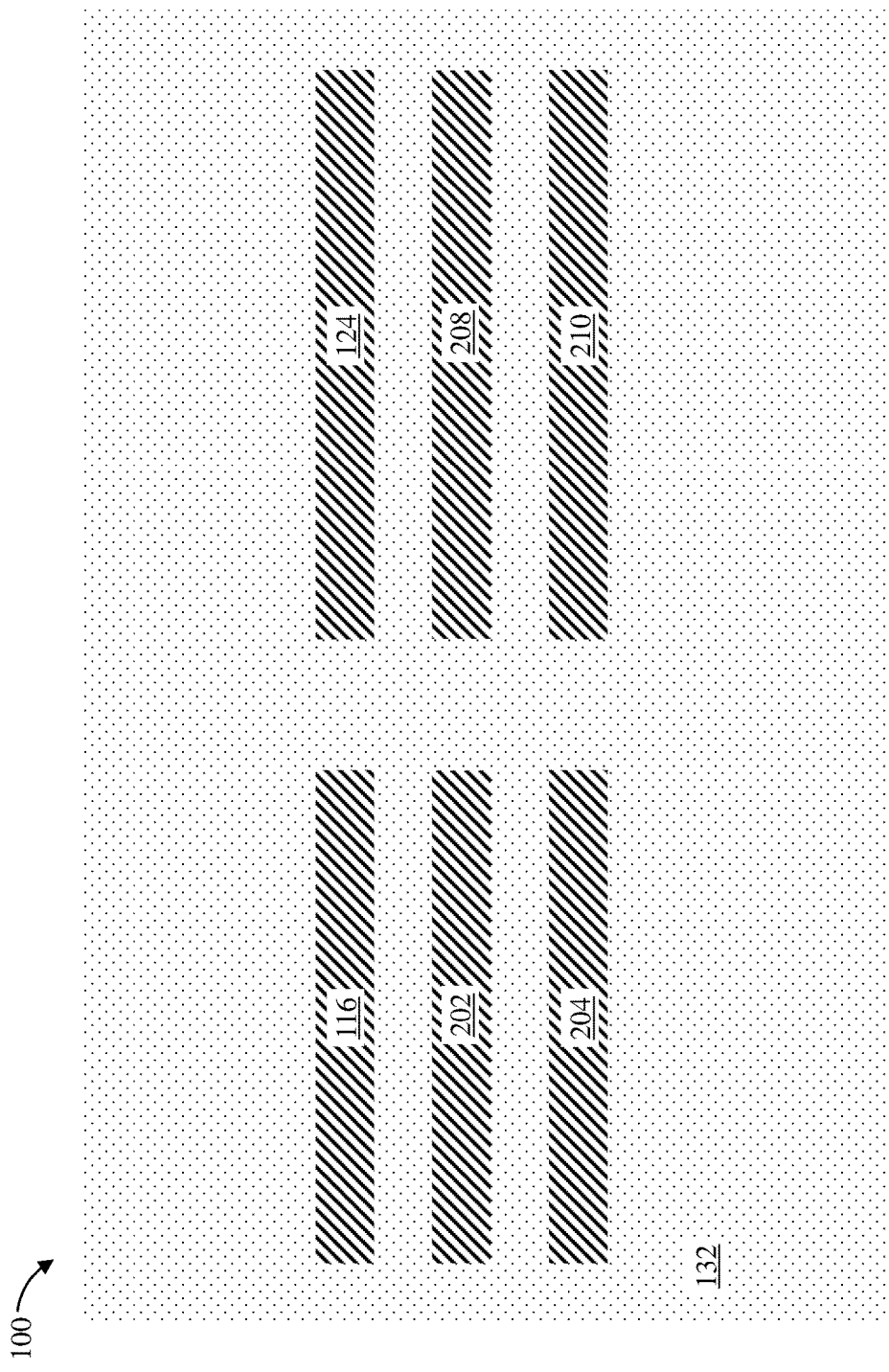
FIG. 2 depicts a top-down view of the structure after forming nanosheet fins adjacent to the first nanosheet stack and the second nanosheet stack during an intermediate operation of a method of fabricating a semiconductor device according to one or more embodiments of the present invention.

FIG. 2 illustrates a top-down view of the structure 100 after forming nanosheet fins adjacent to the first nanosheet stack and the second nanosheet stack during an intermediate operation of a method of fabricating a semiconductor device according to one or more embodiments. As seen from this top-down view, the sacrificial layers 116 and 124 (i.e., the topmost sacrificial layers) can be patterned adjacent to sacrificial layers 202 and 204, and sacrificial layers 208 and 210, respectfully. Any known manner of patterning can be used, such as, for example, a sidewall image transfer (SIT) operation, a wet etch process, or a dry etch process. For ease of discussion reference below is made to operations performed on and to a single nanosheet FET and nanosheet capacitor.

Figure 3:
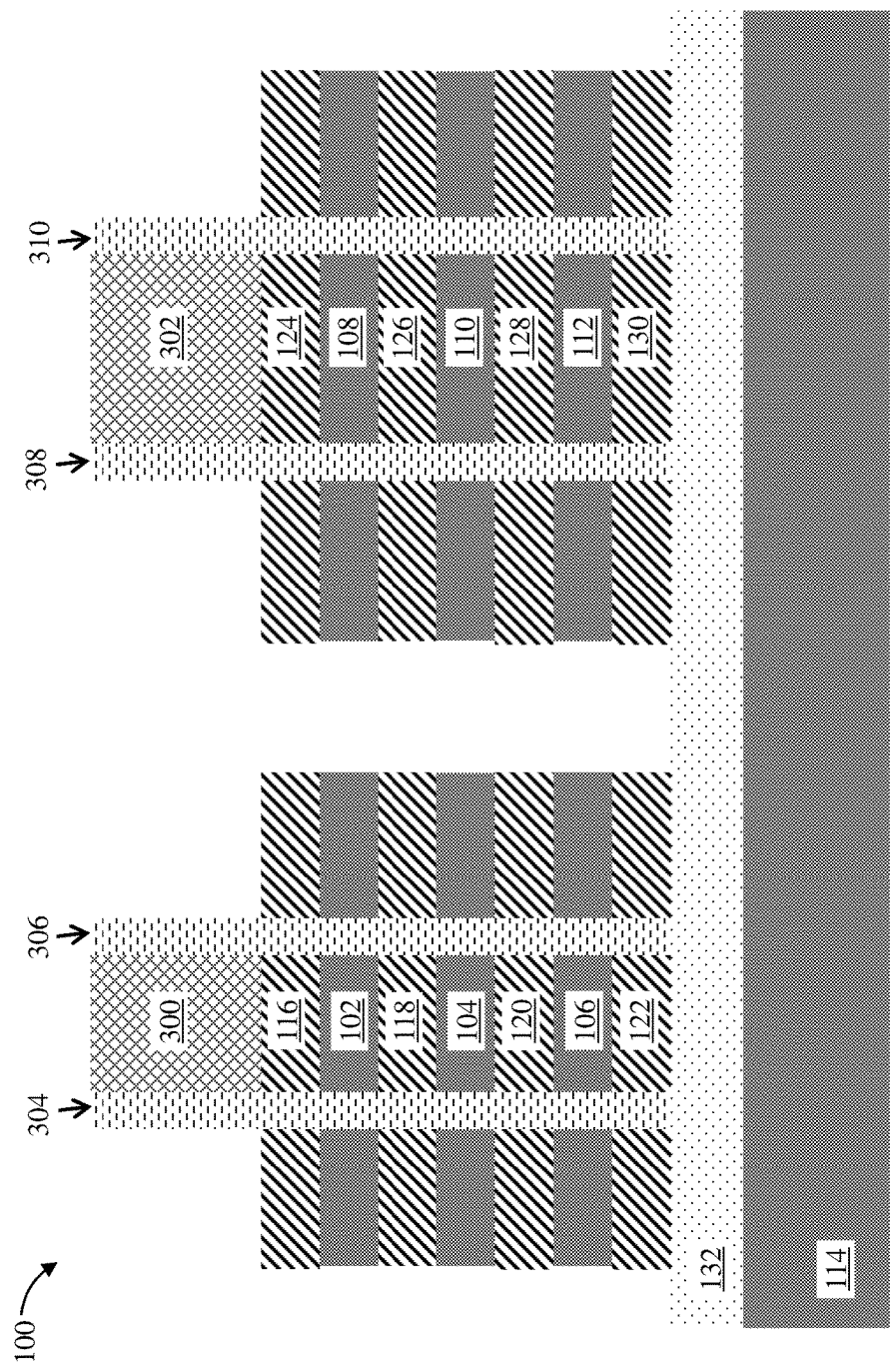
FIG. 3 depicts a cross-sectional view of the structure after forming sacrificial gates over sacrificial layers during an intermediate operation of a method of fabricating a semiconductor device according to one or more embodiments of the present invention.

FIG. 3 illustrates a cross-sectional view of the structure 100 after forming sacrificial gates 300 and 302 over the sacrificial layers 116 and 124, respectfully, during an intermediate operation of a method of fabricating a semiconductor device according to one or more embodiments. In some embodiments, the sacrificial gate 302 is larger (i.e., covers a larger surface area of the respective sacrificial layer) than the sacrificial gate 300. In some embodiments, the sacrificial gate 302 is smaller than or about the same size as the sacrificial gate 300. Any known manner of forming the sacrificial gates 300 and 302 can be utilized. In some embodiments, the sacrificial gates 300 and 302 are formed by patterning a hard mask and using a wet or dry etch process to selectively remove portions of the sacrificial gates 300 and 302 which are not covered by the pattered hard mask. The sacrificial gates 300 and 302 can be any suitable material, such as, for example, amorphous silicon. In some embodiments, a hard mask (not depicted) is formed over each of the sacrificial gates 300 and 302. The hard mask can be any suitable material, such as, for example, a silicon nitride.

In some embodiments, spacers 304 and 306 are formed on sidewalls of the sacrificial gate 300 and extend to a surface of the BOX 132. In some embodiments, spacers 308 and 310 are similarly formed on sidewalls of the sacrificial gate 302. In some embodiments, the spacers 304, 306, 308, and 310 are each formed using a CVD, PECVD, ALD, PVD, chemical solution deposition, or other like processes in combination with a wet or dry etch process. The spacers 304, 306, 308, and 310 can be any suitable material, such as, for example, a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN).

Figure 4:
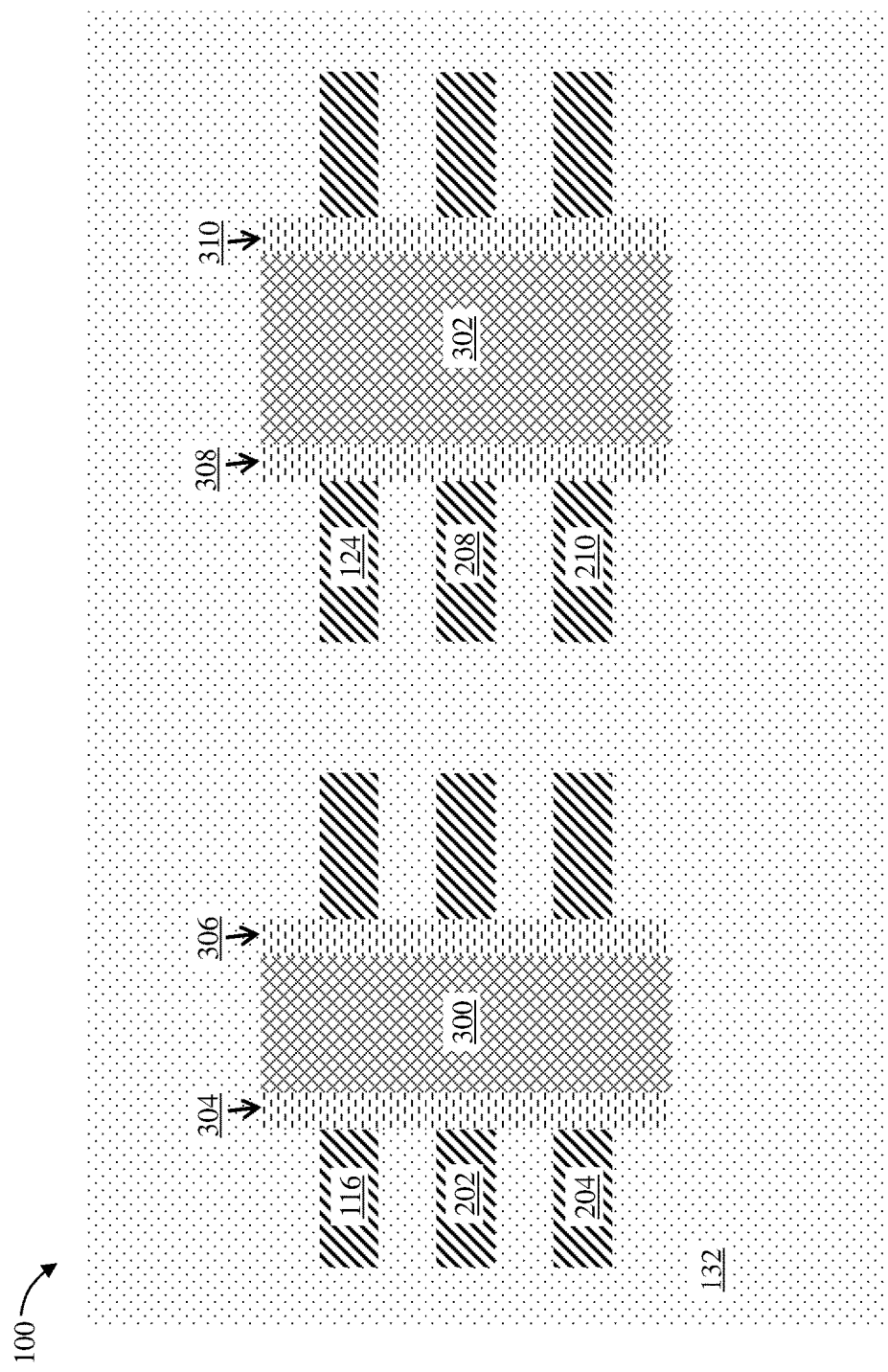
FIG. 4 depicts a top-down view of the structure after forming the sacrificial gates and spacers during an intermediate operation of a method of fabricating a semiconductor device according to one or more embodiments of the present invention.

FIG. 4 illustrates a top-down view of the structure 100 after forming the sacrificial gates 300 and 302 and the spacers 304, 306, 308, and 310 during an intermediate operation of a method of fabricating a semiconductor device according to one or more embodiments. As seen from this top-down view, the sacrificial gates 300 and 302 and the spacers 304, 306, 308, and 310 extend to cover portions of the sacrificial layers 116, 202, and 204, and portions of the capacitor sacrificial layers 124, 208, and 210.

Figure 5:
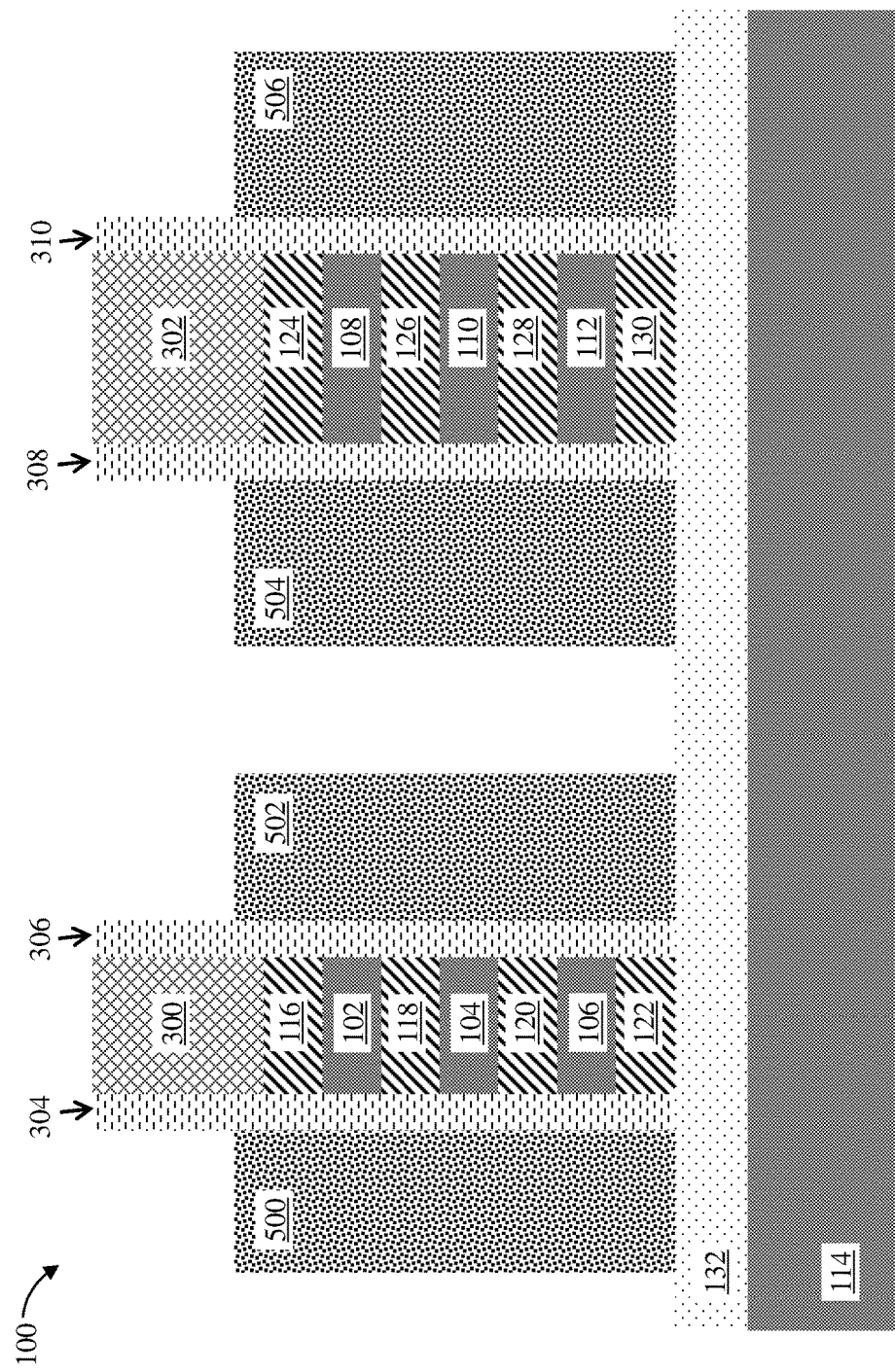
FIG. 5 depicts a cross-sectional view of the structure after forming doped regions during an intermediate operation of a method of fabricating a semiconductor device according to one or more embodiments of the present invention.

FIG. 5 illustrates a cross-sectional view of the structure 100 after forming doped regions 500, 502, 504, and 506 during an intermediate operation of a method of fabricating a semiconductor device according to one or more embodiments. The doped regions 500 and 502 are formed on opposite ends of the FET nanosheets 102, 104, and 106 and the doped regions 504 and 506 are formed on opposite ends of the capacitor nanosheets 108, 110, and 112. The doped regions 500, 502, 504, and 506 can be source or drain regions formed in the substrate 114 or on the BOX 132 by a variety of methods, such as, for example, in-situ doped or doped following the epitaxy, or by implantation and plasma doping. In some embodiments, the doped regions 500 and 502 are complementary, such that one of the doped regions 500 and 502 is a source while the other is a drain. In some embodiments, the doped regions 504 and 506 are similarly complementary. The doped regions 500, 502, 504, and 506 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, doped regions 500, 502, 504, and 506 include epitaxial semiconductor materials grown from gaseous or liquid precursors. In some embodiments, epitaxial regions are epitaxially grown from each exposed surface or sidewall of the FET nanosheets 102, 104, and 106 and the capacitor nanosheets 108, 110, and 112 until the epitaxial regions merge to form the doped regions 500, 502, 504, and 506. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions 500, 502, 504, and 506 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 500, 502, 504, and 506 include silicon. In some embodiments, the doped regions 500, 502, 504, and 506 include carbon doped silicon (Si:C). This Si:C layer can be grown in the same chamber used for other epitaxy steps or in a dedicated Si:C epitaxy chamber. The Si:C can include carbon in the range of 0.2 to 3.0%.

Figure 6:
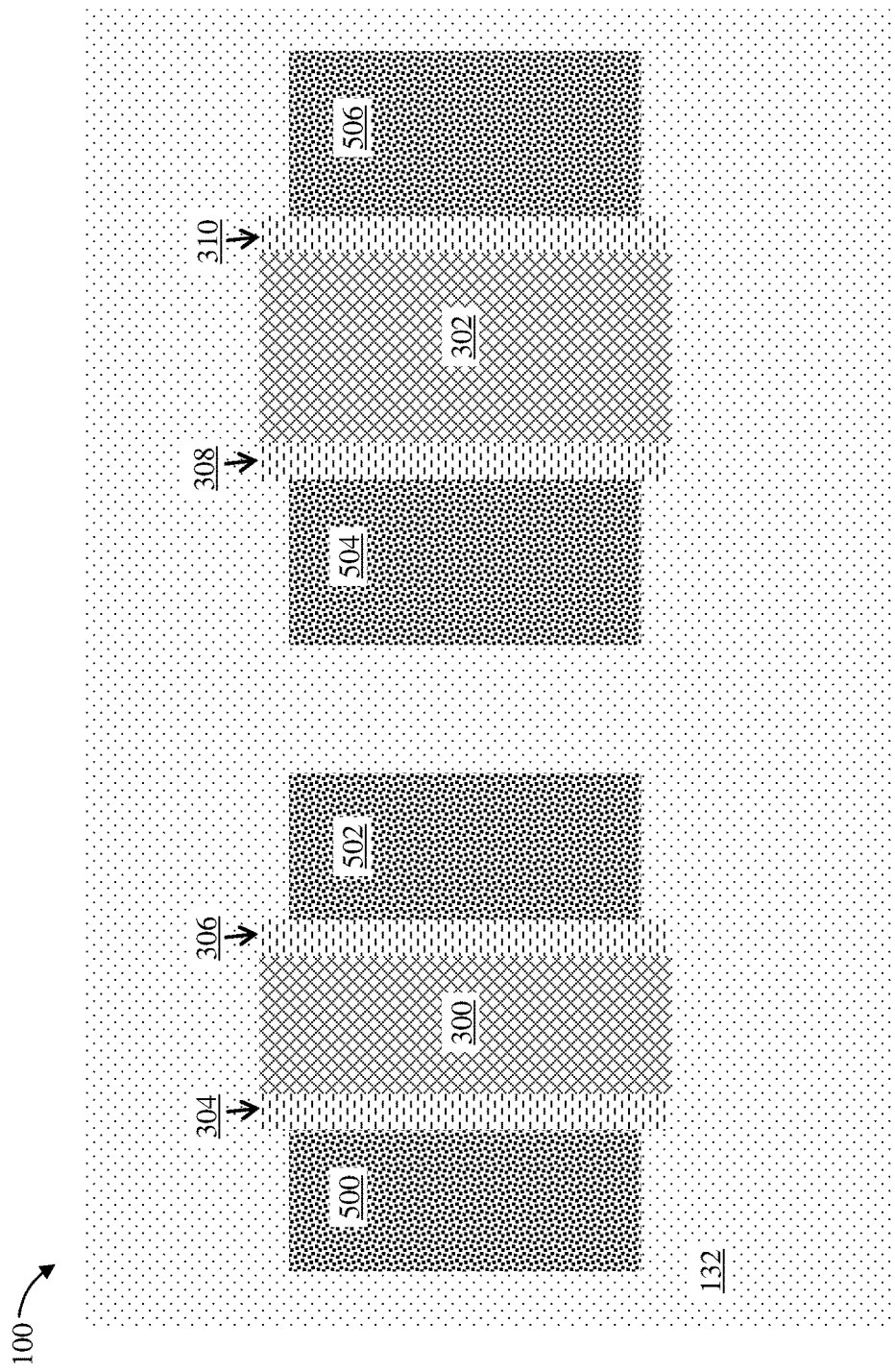
FIG. 6 depicts a top-down view of the structure after forming the doped regions during an intermediate operation of a method of fabricating a semiconductor device according to one or more embodiments of the present invention.

FIG. 6 illustrates a top-down view of the structure 100 after forming the doped regions 500, 502, 504, and 506 during an intermediate operation of a method of fabricating a semiconductor device according to one or more embodiments. As seen from this top-down view, the doped regions 500, 502, 504, and 506 extend to cover portions of the sacrificial layers 116, 202, and 204, and portions of the capacitor sacrificial layers 124, 208, and 210.

Figure 7:
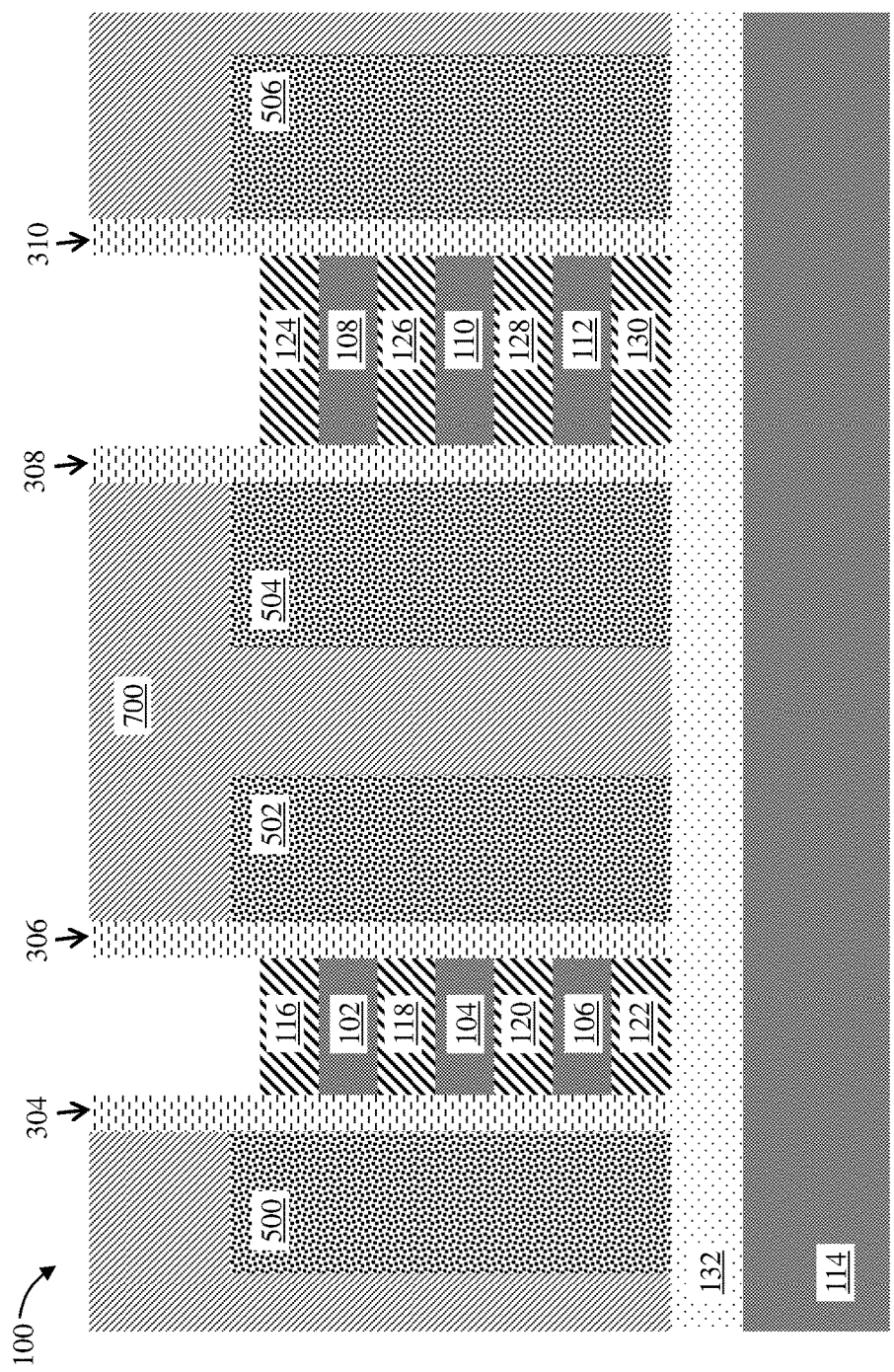
FIG. 7 depicts a cross-sectional view of the structure after forming an interlayer dielectric (ILD) on a buried oxide layer (BOX) during an intermediate operation of a method of fabricating a semiconductor device according to one or more embodiments of the present invention.

FIG. 7 illustrates a cross-sectional view of the structure 100 after forming interlayer dielectric (ILD) 700 on the BOX 132 during an intermediate operation of a method of fabricating a semiconductor device according to one or more embodiments. The ILD 700 can be any suitable material, such as, for example, porous silicates, carbon doped oxides, silicon dioxides, silicon nitrides, silicon oxynitrides, or other dielectric materials. Any known manner of forming the ILD 700 can be utilized. The ILD 700 can be formed using, for example, CVD, PECVD, ALD, flowable CVD, spin-on dielectrics, or PVD. In some embodiments, the ILD 700 is planarized to a top surface of the spacers 304, 306, 308, and 310, using, for example, a CMP operation. The sacrificial gates 300 and 302 are removed using, for example, a wet or dry etch process. In some embodiments, the sacrificial gates 300 and 302 are removed selective to the spacers 304, 306, 308, and 310 and the sacrificial layers 116 and 124. In some embodiments, the sacrificial gates 300 and 302 are removed selective a gate hard mask (not depicted).

Figure 8:
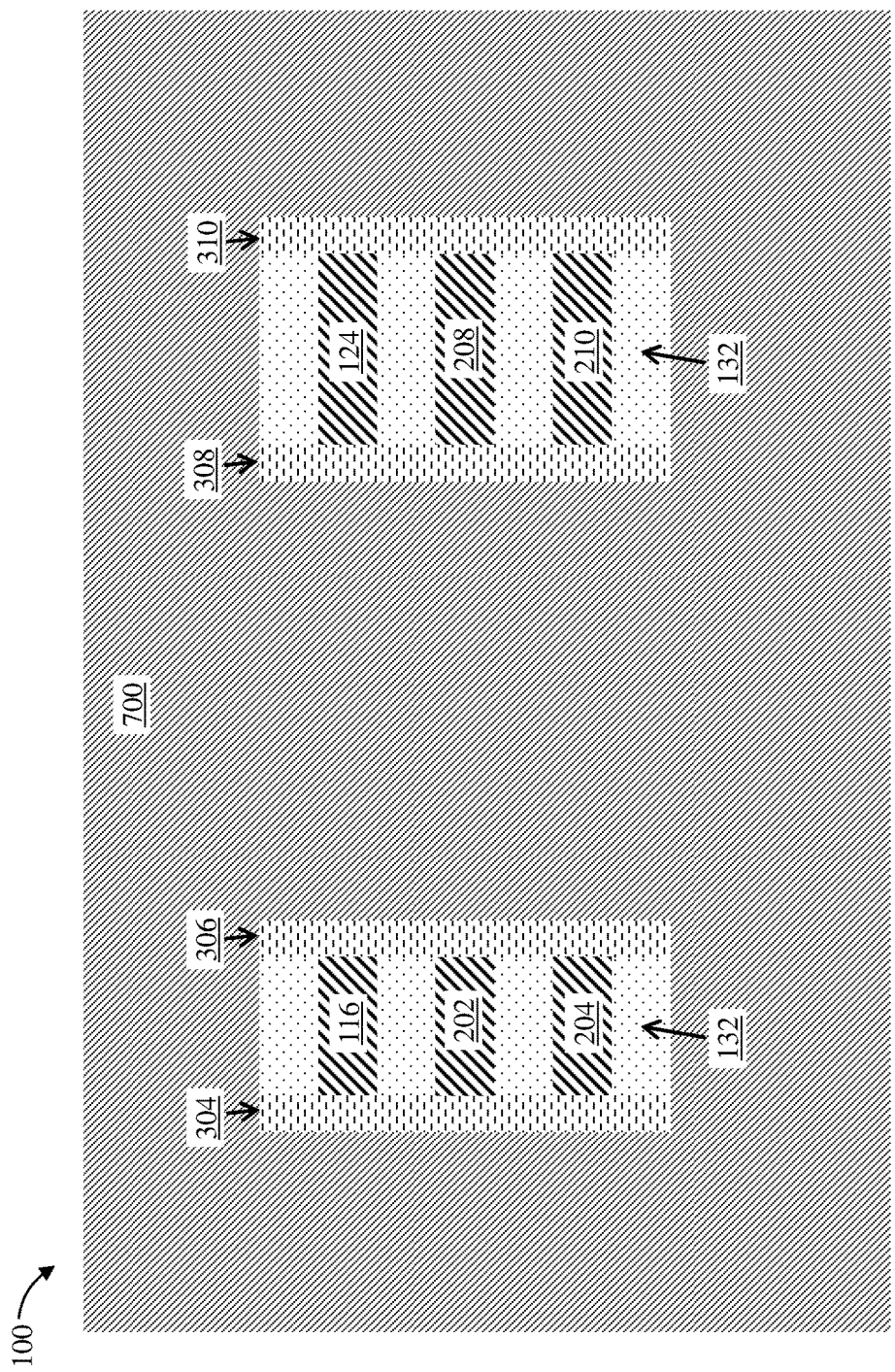
FIG. 8 depicts a top-down view of the structure after removing the sacrificial gates during an intermediate operation of a method of fabricating a semiconductor device according to one or more embodiments of the present invention.

FIG. 8 illustrates a top-down view of the structure 100 after removing the sacrificial gates 300 and 302 during an intermediate operation of a method of fabricating a semiconductor device according to one or more embodiments. As seen from this top-down view, portions of the BOX 132, sacrificial layers 116, 202, and 204, and capacitor sacrificial layers 124, 208, and 210 which were under the sacrificial gates 300 and 302 are now visible.

Figure 9:
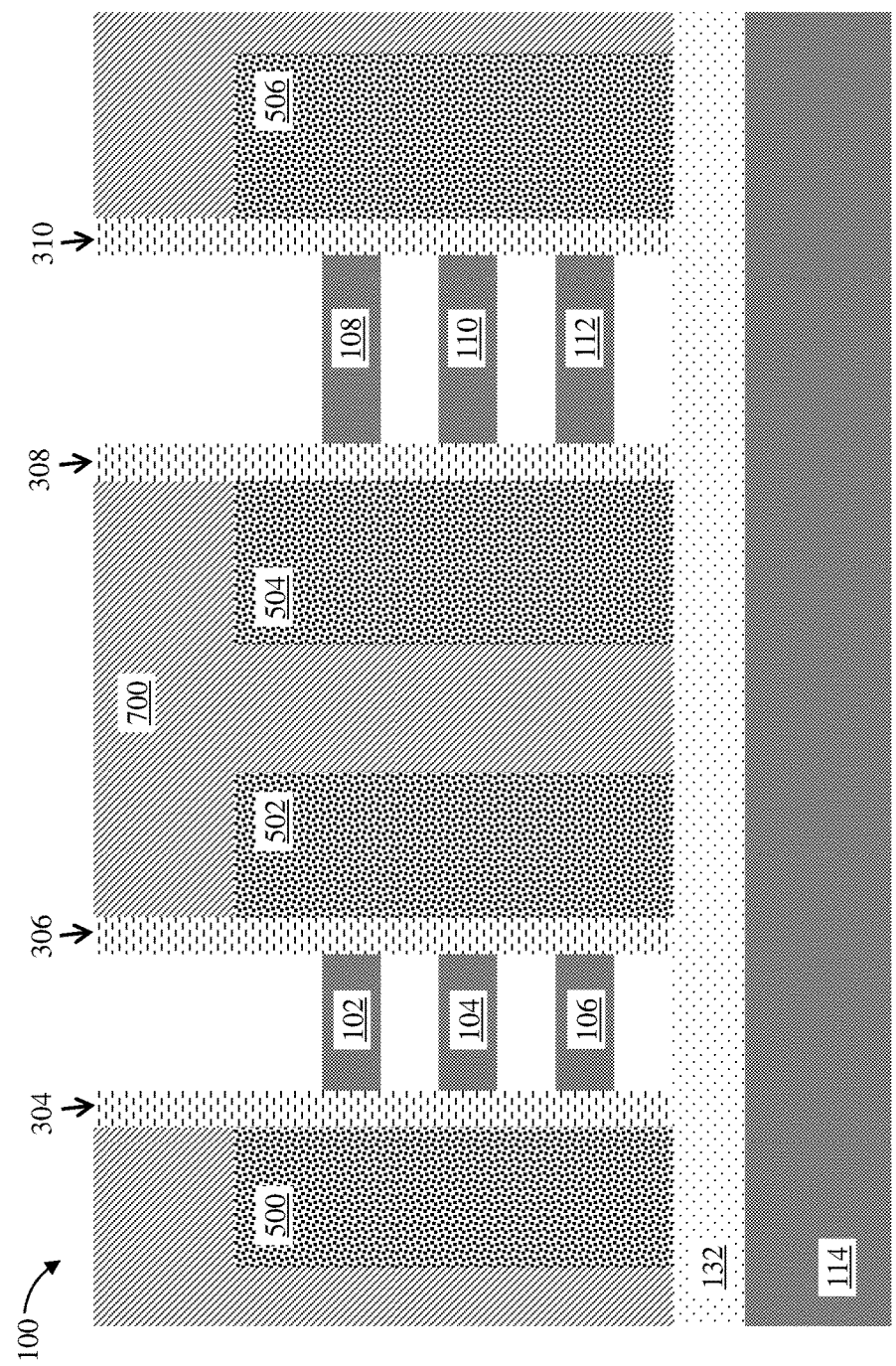
FIG. 9 depicts a cross-sectional view of the structure after removing the sacrificial layers during an intermediate operation of a method of fabricating a semiconductor device according to one or more embodiments of the present invention.

FIG. 9 illustrates a cross-sectional view of the structure 100 after removing the sacrificial layers 116, 118, 120, 122, 124, 126, 128, and 130 during an intermediate operation of a method of fabricating a semiconductor device according to one or more embodiments. Any known removal process can be utilized. In some embodiments, the sacrificial layers 116, 118, 120, 122, 124, 126, 128, and 130 are removed using a wet or dry etch process selective to the FET nanosheets 102, 104, and 106 and the capacitor nanosheets 108, 110, and 112. In some embodiments, an HCl etch is used to remove the sacrificial layers 116, 118, 120, 122, 124, 126, 128, and 130. In another embodiment, a wet etchant TMAH (tetramethyl-ammnoium hydroxide) can be used to remove the sacrificial layers 116, 118, 120, 122, 124, 126, 128 and 130.

Figure 10:
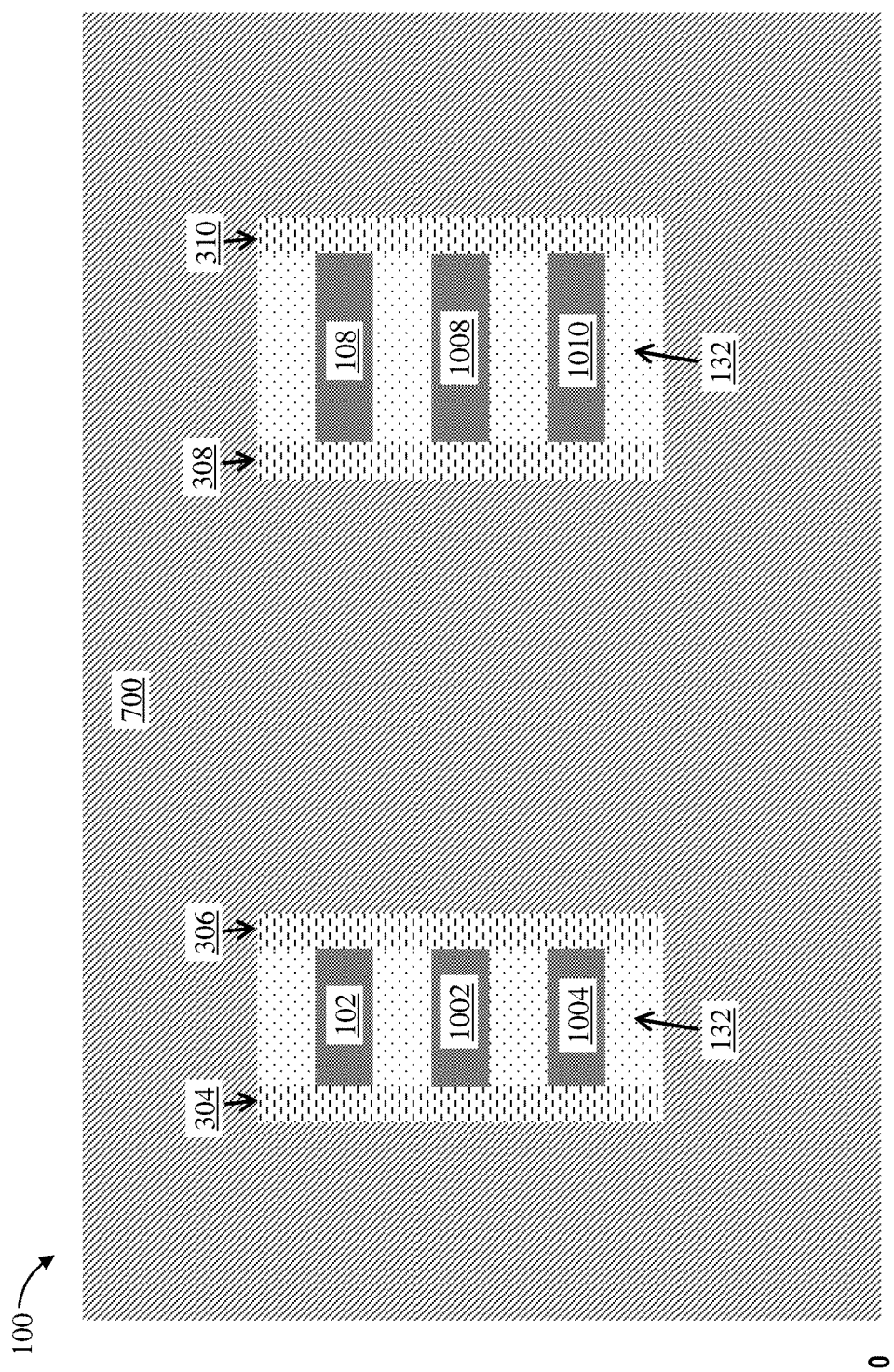
FIG. 10 depicts a top-down view of the structure after removing the sacrificial layers during an intermediate operation of a method of fabricating a semiconductor device according to one or more embodiments of the present invention.

FIG. 10 illustrates a top-down view of the structure 100 after removing the sacrificial layers 116, 118, 120, 122, 124, 126, 128, and 130 during an intermediate operation of a method of fabricating a semiconductor device according to one or more embodiments. As seen from this top-down view, portions of FET nanosheets 102, 1002, and 1004, and portions of capacitor nanosheets 108, 1008, and 1010, which were under sacrificial layers (e.g., sacrificial layers 116 and 124) are now visible.

Figure 11:
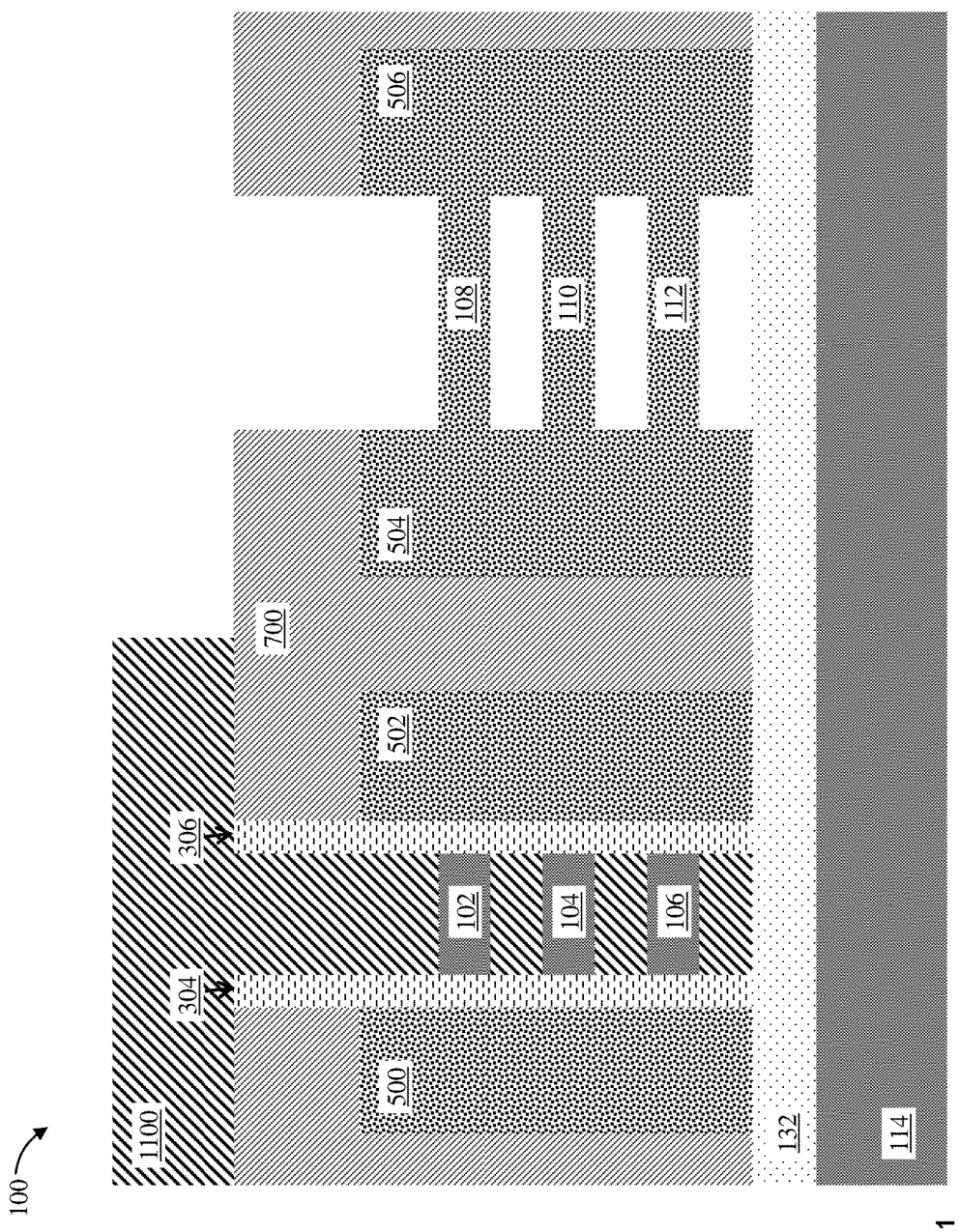
FIG. 11 depicts a cross-sectional view of the structure after forming a hard mask 100 over portions of the ILD, the FET nanosheets, and the spacers during an intermediate operation of a method of fabricating a semiconductor device according to one or more embodiments of the present invention.

FIG. 11 illustrates a cross-sectional view of the structure 100 after forming a hard mask 1100 over portions of the ILD 700, the FET nanosheets 102, 104, and 106, and the spacers 304 and 306 during an intermediate operation of a method of fabricating a semiconductor device according to one or more embodiments. The hard mask 1100 can be formed and patterned using any known process, such as, for example, a block hard mask patterned using a wet etch process. The hard mask 1100 can be any suitable material. In some embodiments, the hard mask 1100 is amorphous carbon. After forming the hard mask 1100, the spacers 308 and 310 are removed. Any known method for removing the spacers 308 and 310 can be utilized. In some embodiments, a selective wet or dry etch process is used.

Portions of the capacitor nanosheets 108, 110, and 112 which are not covered by the doped regions 504 and 506 are themselves doped with an n-type or p-type dopant complementary to the doped regions 504 and 506. For example, an n-type dopant is used when the doped regions 504 and 506 are n-type doped regions. Any known doping process can be used, such as, for example, diffusion and/or ion implantation. In some embodiments, the doped portions of the capacitor nanosheets 108, 110, and 112 are doped with n-type dopants (e.g., phosphorus or arsenic) or p-type dopants (e.g., boron or gallium). The dopant concentration in the doped portions of the capacitor nanosheets 108, 110, and 112 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$. In this manner, the capacitor nanosheets 108, 110, and 112 act as a single electrode between the doped regions 504 and 506.

Figure 12:
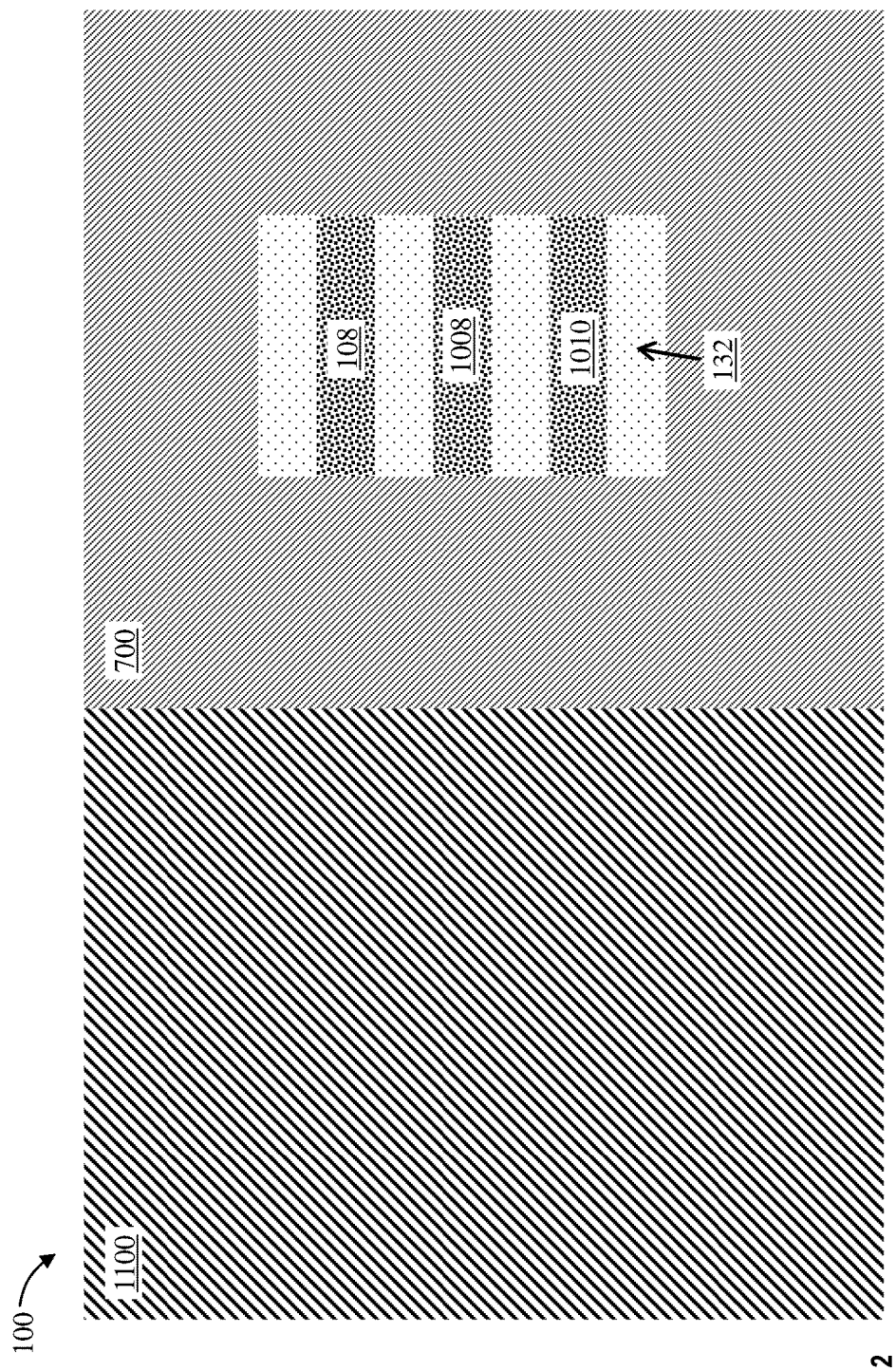
FIG. 12 depicts a top-down view of the structure after doping portions of the capacitor nanosheets during an intermediate operation of a method of fabricating a semiconductor device according to one or more embodiments of the present invention.

FIG. 12 illustrates a top-down view of the structure 100 after doping portions of the capacitor nanosheets 108, 1008, and 1010 during an intermediate operation of a method of fabricating a semiconductor device according to one or more embodiments. As seen from this top-down view, doped portions of the capacitor nanosheets 108, 1008, and 1010, which were under the spacers 308 and 310, are now visible.

Figure 13:
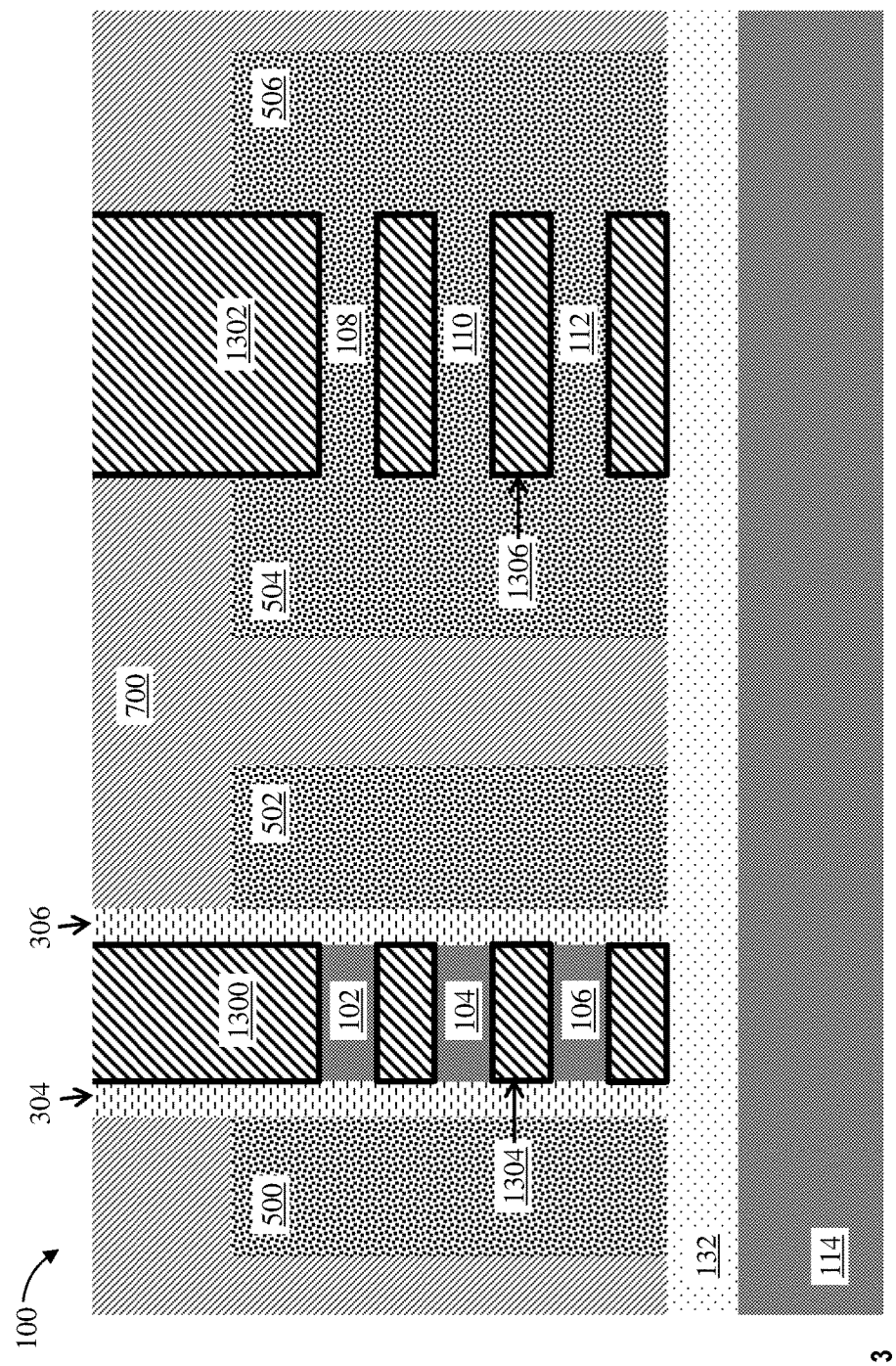
FIG. 13 depicts a cross-sectional view of the structure after removing the hard mask during an intermediate operation of a method of fabricating a semiconductor device according to one or more embodiments of the present invention.

FIG. 13 illustrates a cross-sectional view of the structure 100 after removing the hard mask 1100 during an intermediate operation of a method of fabricating a semiconductor device according to one or more embodiments. The hard mask 1100 can be removed using any known process, such as, for example, a wet or dry etch process. After removing the hard mask 1100, conductive gates 1300 and 1302 are formed to wrap around channel portions of the FET nanosheets 102, 104, and 106 and capacitor nanosheets 108, 110, and 112, respectfully. In some embodiments, the conductive gate 1300 includes a high-k dielectric region 1304 and the conductive gate 1302 includes a high-k dielectric region 1306. In some embodiments, the high-k dielectric regions 1304 and 1306 modify the work function of each respective gate. Any known composition and manner of forming the conductive gates 1300 and 1302 having high-k dielectric regions 1304 and 1306 can be utilized. The conductive gates 1300 and 1302 can be made of, for example, tungsten (W). In this manner, the conductive gate 1302 acts as a first terminal and the doped regions 504 and 506 act as a second terminal.

The high-k dielectric regions 1304 and 1306 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric regions 1304 and 1306 can have a thickness of about 0.5 nm to about 4 nm. In some embodiments, the high-k dielectric regions 1304 and 1306 can have a thickness of about 2 nm to about 3 nm, although other thicknesses are within the contemplated scope of the invention. In some embodiments, one or more work function metal layers (not shown) maybe be formed on the high k dielectric material (e.g., the high-k dielectric regions 1304 and 1306) in channel portions of the FET nanosheets 102, 104, and 106 and capacitor nanosheets 108, 110, and 112. Exemplary work function materials include for example, aluminum, lanthanum oxide, magnesium oxide, strontium titanate, strontium oxide, titanium nitride, titanium aluminum nitride, titanium aluminum carbide, tantalum nitride, and combinations thereof.

Figure 14:
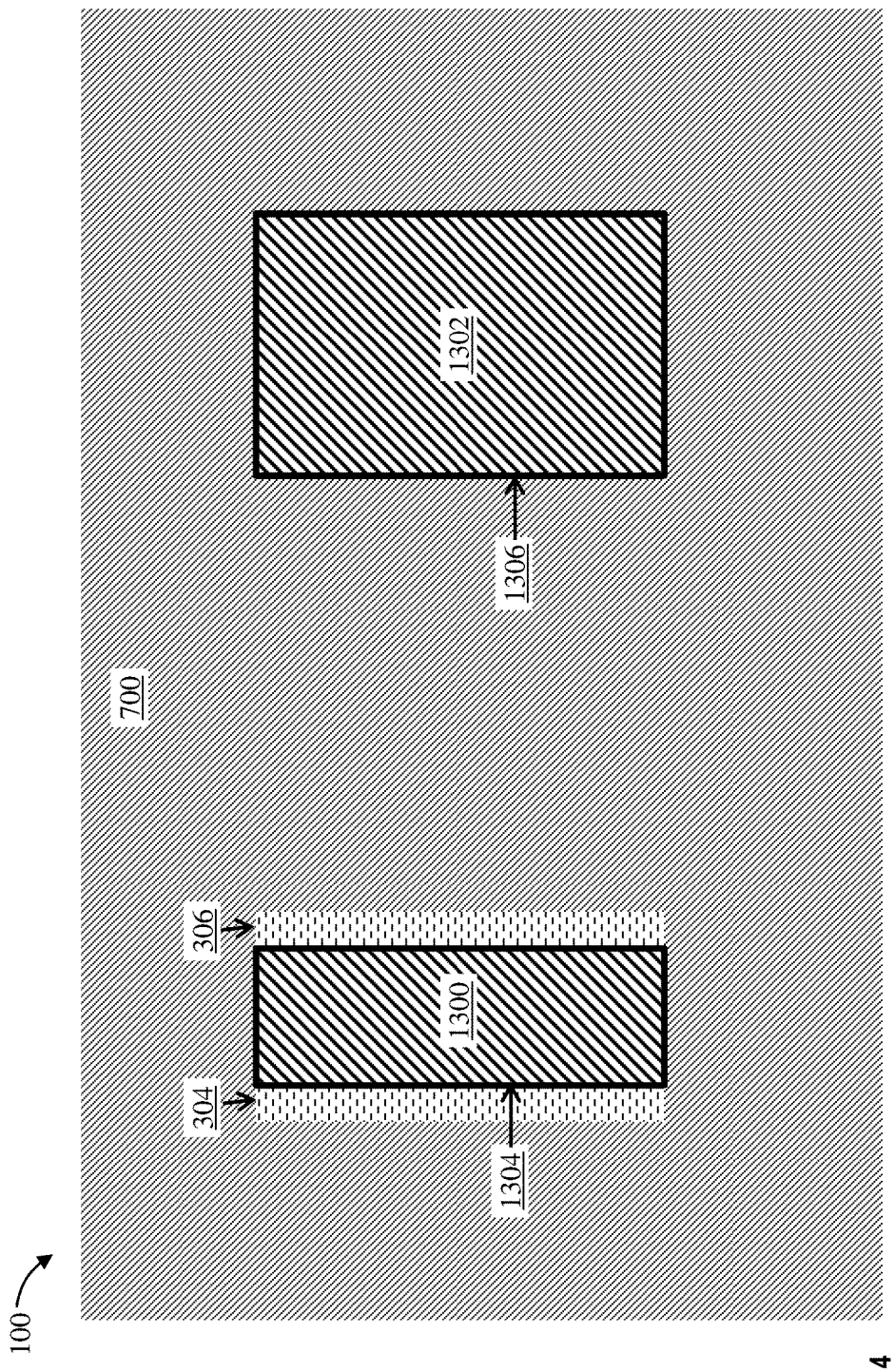
FIG. 14 depicts a top-down view of the structure after forming conductive gates during an intermediate operation of a method of fabricating a semiconductor device according to one or more embodiments of the present invention.

FIG. 14 illustrates a top-down view of the structure 100 after forming the conductive gates 1300 and 1302 during an intermediate operation of a method of fabricating a semiconductor device according to one or more embodiments. As seen from this top-down view, the conductive gates 1300 and 1302 cover the FET nanosheets 102, 1002, and 1004 and the capacitor nanosheets 108, 1008, and 1010.

Figure 15:
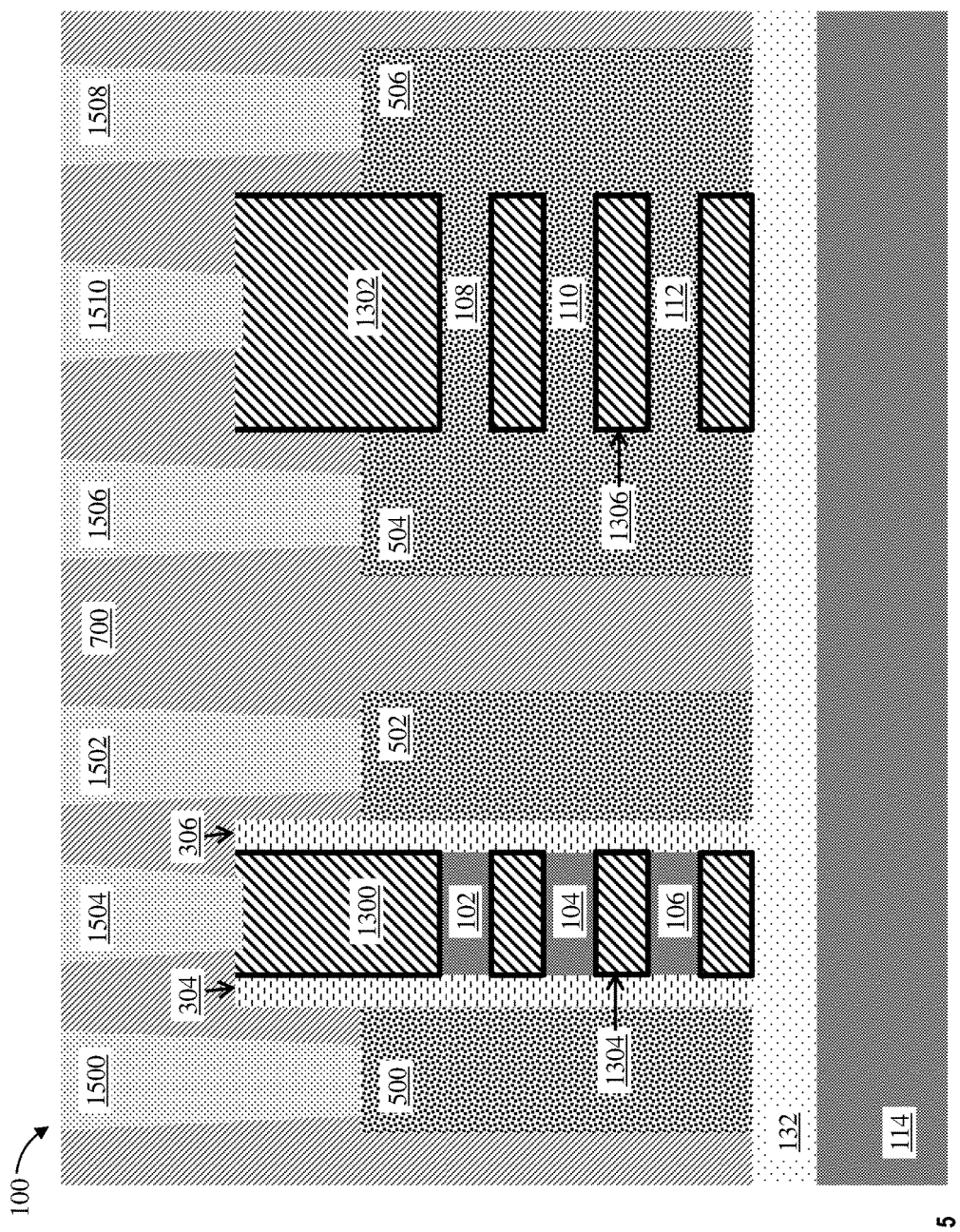
FIG. 15 depicts a cross-sectional view of the structure after a metallization operation forms a first FET contact contacting a surface of a doped region, a second FET contact 152 contacting a surface of a doped region, and a FET gate contact contacting a surface of a conductive gate during an intermediate operation of a method of fabricating a semiconductor device according to one or more embodiments of the present invention.

FIG. 15 illustrates a cross-sectional view of the structure 100 after a metallization operation forms a first FET contact 1500 contacting a surface of the doped region 500, a second FET contact 1502 contacting a surface of the doped region 502, and a FET gate contact 1504 contacting a surface of the conductive gate 1300 during an intermediate operation of a method of fabricating a semiconductor device according to one or more embodiments. In some embodiments, a first capacitor contact 1506 contacting a surface of the doped region 504, a second capacitor contact 1508 contacting a surface of the doped region 506, and a capacitor gate contact 1510 contacting a surface of the conductive gate 1300 are formed in a similar manner. In some embodiments, only one of the capacitor contacts 1506 and 1508 are formed. In some embodiments, both of the capacitor contacts 1506 and 1508 are formed and operate as a single contact with an increased contact area. Any known manner of forming or depositing the contacts 1500, 1502, 1504, 1506, 1508, and 1510 can be utilized. In some embodiments, the ILD 700 is extended with additional material, patterned with open trenches, and the contacts 1500, 1502, 1504, 1506, 1508, and 1510 are deposited into the trenches. In some embodiments, the contacts 1500, 1502, 1504, 1506, 1508, and 1510 are overfilled into the trenches, forming overburdens above a surface of the ILD 700. In some embodiments, a CMP selective to the ILD 700 removes the overburden.

The contacts 1500, 1502, 1504, 1506, 1508, and 1510 can be of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts 1500, 1502, 1504, 1506, 1508, and 1510 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
    a nanosheet capacitor adjacent to a nanosheet field effect transistor, the nanosheet capacitor comprising:
    a nanosheet stack formed over a substrate, the nanosheet stack comprising a first nanosheet vertically stacked over a second nanosheet, the first and the second nanosheet comprising a same semiconductor material;
    a first source or drain region adjacent to a first end of the nanosheet stack;
    a second source or drain region adjacent to a second end of the nanosheet stack, the first and second ends on opposite sides of the nanosheet stack;
    a dopant formed in a channel region of the first and second nanosheets of the nanosheet stack; and
    a gate formed over the channel region of the first and second nanosheets of the nanosheet stack, the gate wrapping around the channel region of each of the first and second nanosheets and filling a gap between the first and second nanosheets;
    wherein the first source or drain region, the second source or drain region, and the first and second nanosheets comprise a same doping type; and
    wherein the first and second nanosheets are doped such that the first and second nanosheets act as a single electrode between the first and second source or drain regions.

2. The semiconductor device of claim 1, wherein the first and second source or drain regions are n-type doped regions and the dopant comprises an n-type dopant.

3. The semiconductor device of claim 2, wherein the n-type dopant is selected from the group consisting of phosphorus and arsenic.

4. The semiconductor device of claim 1, wherein the first and second source or drain regions are p-type doped regions and the dopant comprises a p-type dopant.

5. The semiconductor device of claim 4, wherein the p-type dopant is selected from the group consisting of boron and gallium.

6. The semiconductor device of claim 1, wherein each nanosheet of the nanosheet stack has a thickness of about 4 nm to about 10 nm.

7. The semiconductor device of claim 1, wherein each nanosheet of the nanosheet stack has a thickness of about 6 nm.

8. The semiconductor device of claim 1, wherein a concentration of the dopant formed in the channel region of the first and second nanosheets of the nanosheet stack is about $1 \times 10^{19}$ cm$^{-3}$ to about $2 \times 10^{21}$ cm$^{-3}$.

9. The semiconductor device of claim 1, wherein a concentration of the dopant formed in the channel region of the first and second nanosheets of the nanosheet stack is about $1 \times 10^{20}$ cm$^{-3}$ to about $1 \times 10^{21}$ cm$^{-3}$.

* * * * *